United States Patent [19]
Ashworth

[11] Patent Number: 5,680,222
[45] Date of Patent: Oct. 21, 1997

[54] METHOD AND APPARATUS FOR PREPARING COLOR SCREENS IN A HALFTONE IMAGE

[75] Inventor: William Frederick Ashworth, Johnsonville, New Zealand

[73] Assignee: Megadot Systems Limited, Wellington, New Zealand

[21] Appl. No.: 503,624

[22] Filed: Jul. 18, 1995

Related U.S. Application Data

[63] Continuation of Ser. No. 928,424, Aug. 13, 1992, abandoned.

[30] Foreign Application Priority Data

| Aug. 13, 1991 | [NZ] | New Zealand | 239389 |
| Nov. 18, 1991 | [NZ] | New Zealand | 240636 |
| Dec. 13, 1991 | [NZ] | New Zealand | 240979 |
| May 1, 1992 | [NZ] | New Zealand | 242583 |

[51] Int. Cl.$^6$ .................... H04N 1/40; H04N 1/52
[52] U.S. Cl. .................... 358/298; 358/533; 358/536
[58] Field of Search .................... 358/298, 454–459, 358/533–536; 382/167; 283/93; 101/93.03, 170

[56] References Cited

U.S. PATENT DOCUMENTS

| 3,725,574 | 4/1973 | Gast | 346/108 X |
| 4,084,183 | 4/1978 | Keller et al. | 358/298 |
| 4,149,183 | 4/1979 | Pellar et al. | 358/75 |
| 4,185,304 | 1/1980 | Holladay | 358/298 |
| 4,196,451 | 4/1980 | Pellar | 358/283 |
| 4,680,645 | 7/1987 | Dispoto et al. | 358/298 |
| 4,894,726 | 1/1990 | Steinhardt et al. | 358/298 |
| 4,916,545 | 4/1990 | Granger | 358/456 |
| 4,918,622 | 4/1990 | Granger et al. | 358/298 X |
| 5,233,441 | 8/1993 | Hamilton | 358/459 |
| 5,239,391 | 8/1993 | Hamilton | 358/459 |

FOREIGN PATENT DOCUMENTS

| 0 370 271 | 5/1990 | European Pat. Off. | |
| 370371 | 5/1990 | European Pat. Off. | B27K 3/50 |
| 20 25 609 | 12/1970 | Germany | |
| 29 17 242 | 11/1980 | Germany | |
| WO90/06034 | 5/1990 | WIPO | H04N 1/40 |
| WO90/10991 | 9/1990 | WIPO | H04N 1/46 |

OTHER PUBLICATIONS

K. Haller, Fogra Research Report 6.029 (1982). (Including excerpts translated into English of pp. 3, 8, 9, 14, 18, 19, 20, 25, 26 and 27).

Hell GMBH Dot Shapes, 6 pages (Pre–1991).

C. Eliezer, "Color Screening: How to Judge the Results", *The Seybold Report on Publishing Systems*, vol. 21, No. 11, pp. 3–11 (Feb. 29, 1992).

C. Eliezer, "Color Screening Technology: A Tutorial on the Basic Issues", *The Seybold Report on Desktop Publishing*, vol. 6, No. 2, pp. 3–25 (Oct., 1991).

*Desktop to Press*, No. 9, 13 pages (Feb., 1992).

*Primary Examiner*—Eric Frahm
*Attorney, Agent, or Firm*—Sterne, Kessler, Goldstein & Fox P.L.L.C.

[57] ABSTRACT

The dot patterns which may be used to reduce dot gain and moiré effects in halftone images involve printing areas which have inwardly curved edges and variable elongation. Colored images having screens which use these patterns may be printed with the screens at 45° relative angular separations. Alternatively the dot patterns may be regarded as reversed variable oval patterns with varying elongation of the generally oval shaped non-printing areas.

24 Claims, 10 Drawing Sheets ced overall as a reversed elliptical dot pattern in which the
METHOD AND APPARATUS FOR PREPARING COLOR SCREENS IN A HALFTONE IMAGE This application is a continuation of application No. 07/928,424, filed Aug. 13, 1992 now abandoned.

BACKGROUND OF THE INVENTION

1. Field of the Invention

This invention relates to printing processes and in particular to dot patterns used when preparing halftone images. These patterns include shapes which reduce the perceptibility of certain moiré effects and various tone jumps which are often seen.

2. Description of the Prior Art

In most printing processes it is only possible to apply a single tone of each available ink color to the print media. Tone variation is then achieved by breaking up each image into fine dots of varying size on a half tone screen grid. Color variation is normally achieved by superimposing screens of the primary colors cyan, magenta and yellow, plus black for definition. Ideally human vision integrates the dots over a well prepared image into an accurate impression of the original scene. A final image will almost always include a number of compromises between practical limitations and defects in the printing process, and what can actually be perceived by the human eye and brain.

Round dots at 45° to vertical are least perceptible for a given spacing or screen ruling (or dot frequency), and single color images are conventionally printed in this manner. Other dot shapes or combinations of shapes such as square and "elliptical" (diamond shape) are sometimes used, but all have generally straight or outwardly curved edges around the full length of their perimeters. The dots are usually created in square cells forming rows spaced at between about 30/cm for newsprint and about 60/cm for higher quality images. In light tones the dots remain distinct on a light background provided by the print medium, but merge in darker tones which then appear as light dots on a dark background. The printed and non-printed areas of an image therefore appear to reverse from dots to background and background to dots respectively as tone darkens.

When printing color images undesirable moiré effects in the form of large and small scale patterns are often seen due to periodic alignment of the dots as a whole and of their edges. The large scale patterns are typically bands which intersect to form squares on the order of tens or more dots along each side. This effect is largely removed by suitable relative rotation of the color screens such as by cyan 15°, magenta 45°, yellow 90° and black 75° anticlockwise from horizontal. Complex mathematical procedures are often used to establish suitable angles. Placing the screens without relative rotation or offset can cause color shifts in an image where colors of differing opacity, particularly black and yellow, overlap consistently over a large region. Subtle color shifts may occur in any case due to mis-registration of the screens during their superposition. The small scale patterns of moiré effects are typically rosettes on the order of a few dots width, which cause perceptible speckling of otherwise uniformly colored areas. This effect has proved more difficult to remove.

A further problem often arises in printing halftone images, known as dot gain, amid tones where adjacent dots are so sufficiently large as to become linked by imprecision in their reproduction. For example in lithography, which includes offset printing, a greasy ink is confined to printing areas of an image plate by dampening the surrounding non-printing areas with water. Unfortunately surface tension at the ink/water interfaces can cause or enhance bridging between closely spaced printing areas creating sudden tone jumps. Ink absorption on poor quality print paper can also lead to bridging. Round and square dots formed in square cells naturally meet their nearest neighbors at 78% and 50% printing area densities, respectively. Dot gain causes bridging at slightly higher densities creating discontinuities in regions of an intended smoothly varying tone. This effect is also difficult to remove completely.

Preparation of halftone images is largely carried out using computer controlled devices such as scanners and imagesetters. A photograph or other artwork to be reproduced is scanned and the original scene is stored in electronic memory or output directly. The images can be manipulated and/or combined with text before a printing medium such as a film or plate is produced. It is normally only in the final output stages that an image is converted to halftone dot screens. The manipulations are complex software operations which may be varied to suit particular images. Similar software is used in other electronic printing and imagesetting processes such as desktop publishing. Precise control of the dot patterns is necessary in preparing acceptable images, and the computations required for high quality images are often extensive and time consuming. For example, software methods for reducing moiré effects are disclosed in U.S. Pat. No. 4,084,183 (congruent screens), U.S. Pat. No. 4,894,726 (quasi periodic screens) EP 370217 (elongated conventional dots), WO 90/10991 (rectilinear screen transposition ) and WO 90/06304 (pseudo random variation of dot shapes). Some images are still prepared using conventional photomechanical equipment such as contact screens. Good summaries of known dot patterns, their various problems and moiré effects are to be found in *Colour Screening Technology; A Tutorial on the Basic Issues*, The Seybold Report on Desktop Publishing, Vol. 6, No. 2, October 1991, Seybold Publications, Inc., PA, USA, and *Desktop To Press*, Issue 9, February 1992, Peter Fink Communications Inc., CA, USA.

SUMMARY OF THE INVENTION

It is an object of the present invention to provide an alternative dot pattern which can be used to reduce rosette moiré, dot gain and tone jump effects in halftone images.

A halftone image having a dot pattern according to the invention is created by printing dots having inwardly curved edges. In light tones the dots may resemble pin cushions having pronounced cusps. In dark tones the dots are effectively merged to create non-printing dots which may be oval shaped. As tone varies from light to dark, the pin cushions are increasingly elongated along one direction and meet their nearest neighbors in two distinct stages, first in the direction of elongation, and then in a direction substantially perpendicular to it. The dot screen is typically formed from a square lattice so there are typically four nearest neighbors symmetrically placed at equal distances. As tone continues to darken after the dots have joined, the elongation is gradually decreased so that the oval shaped non-printing dots approach round dots. The pattern may also be considered overall as a reversed elliptical dot pattern in which the ellipses vary from round to a maximum ellipticity and back to round across the full range of tones. When a number of screens are superimposed the inwardly curved edges of the printing areas do not align so readily to form perceptible rosettes as do conventional dots. Further, the elongation may be varied so that dot gain occurs in tones where its perceptibility also is minimized.

At the present time as this specification is prepared, the optimum uses and the ramifications of the invention have not been fully explored. In preparing colored images it has been found that the primary color and black screens are best placed at approximately 45° separations from each other. For example cyan 45°, magenta 135°, yellow 90° and black 0°. Screens which are separated by 90° may generally be regarded alternatively as being at 0° so that in this example there are essentially only two angles for computation of dot patterns, 0° and 45°. This represents a considerable computational simplification over conventional screen angles.

The cyan and magenta screens will normally have a deliberate offset or mis-registration from each other to avoid possible color shifts. Yellow and black screens may also be offset from each other, and may be printed with little or no elongation of the dots. The yellow and/or black screen rulings may also be increased and/or decreased relative to cyan and magenta. Final determination of these possibilities awaits full software implementation of the invention and will depend on particular images.

BRIEF DESCRIPTION OF THE DRAWINGS

Examples of the invention will be described with reference to the drawings of which.

DETAILED DESCRIPTION OF THE PREFERRED EMBODIMENTS

Referring to the accompanying figures it will be seen that the dot patterns are magnified about 10 to 100 times in black and white for purposes of their description. The visual effects resulting from integration by the human eye over a halftone image at normal scales are not evident but should be appreciated by a skilled reader. Particularly the improvements to be obtained in color images by inwards curvature of printing dot edges in light to middle tones and to be obtained in single color images by dot elongation will be appreciated.

Figure 9:
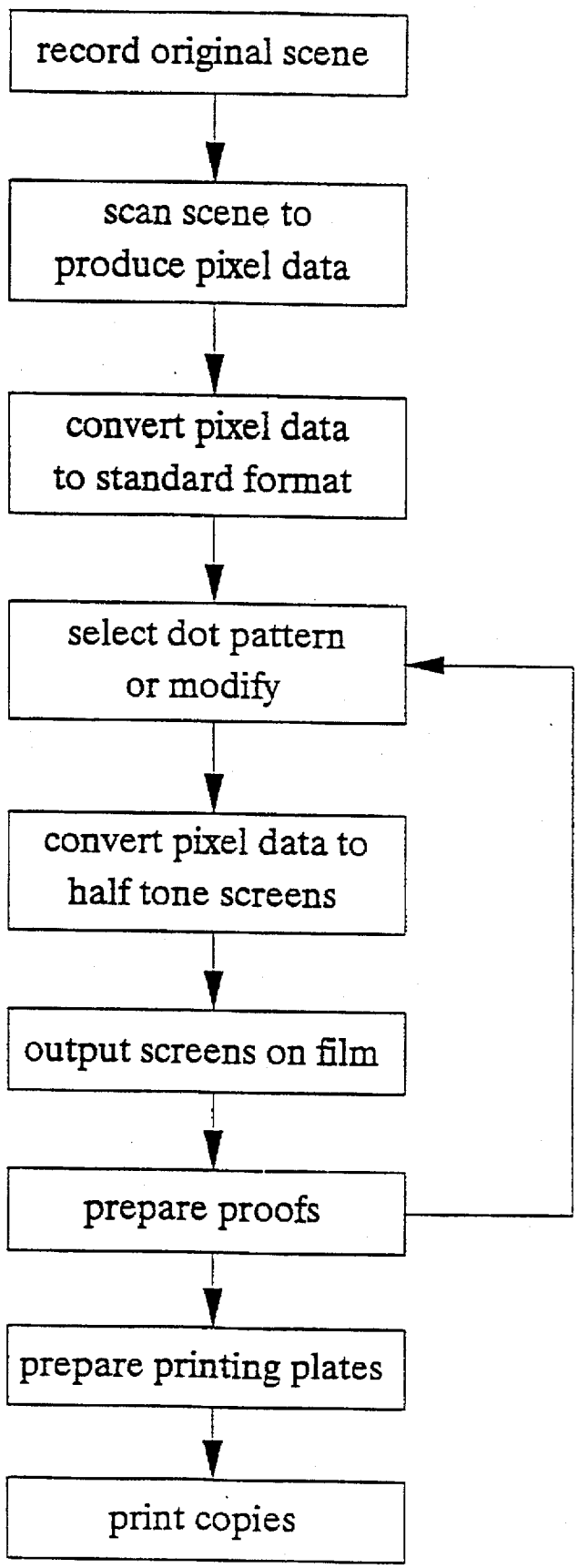
FIG. 9 is a flowchart indicating a general process in which the invention may be implemented.

The various forms of computer hardware and software used to implement dot patterns according to the invention will also be known to the skilled reader, or at least will be available for consideration through the references given above, particularly the Seybold and Fink articles. For example, a range of desktop publishing and high end scanner equipment and software is available through suppliers such as Adobe, Agfa, Crosfield, Linotype-Hell and Scitex. As new patterns are developed the hardware and/or software may be correspondingly upgraded. A typical process of preparing a halftone image, particularly a colored image as implemented on their equipment, is outlined in the flowchart of FIG. 9.

In general terms, a scene is electronically scanned from a film or other artwork to be printed, or recorded in some other digital process, and the data obtained is stored as pixel based color and intensity information. The pixels are generally aligned with the vertical and horizontal directions of movement of the scanner. The data is then processed into a standardized format such as known under the trade mark POSTSCRIPT and from there into up to four halftone screens which represent the primary colors and black as required. These screens are created from the pixel information by various raster image processor programs which calculate the dot shapes, dot frequencies and screen rotation angles. An operator normally has a range of dot patterns available through software installed on the equipment. The operator selects appropriate shapes, frequencies and angles in reaching an acceptable image during proofing. In traditional printing operations each screen is then output individually, to create up to four films or plates which are used to print multiple copies of the final black and white or colored image. This part of the process is known as imagesetting in the case of desktop publishing and as scanner output in the case of "high end" systems. In other computer-based operations, such as ink jet or laser printing it is possible to output a colored image directly.

Figure 10:
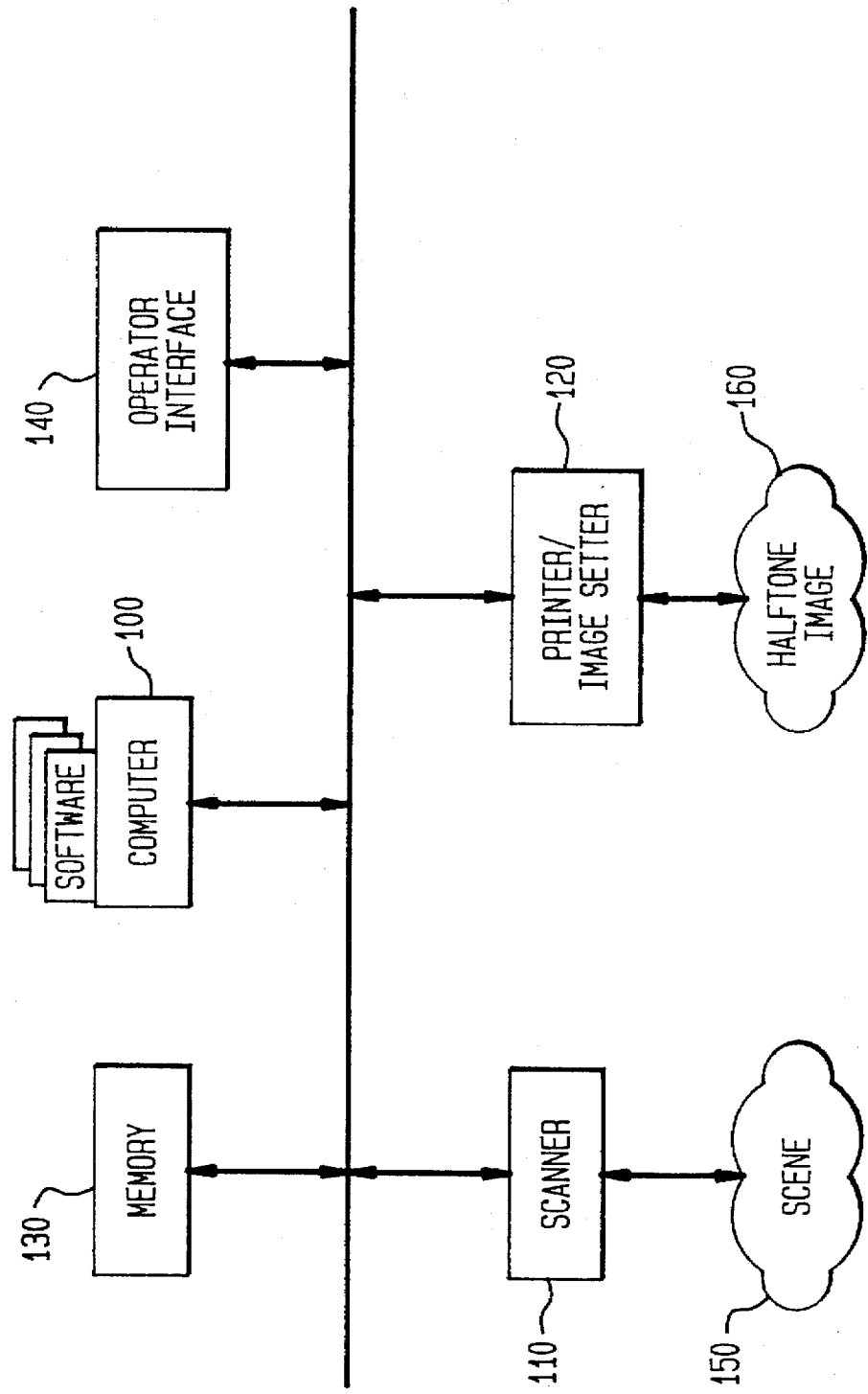
FIG. 10 is an exemplary, high-level block diagram of a computer system according to the present invention.

As noted above, preparation of halftone images is typically carried out using computer controlled devices such as scanners and imagesetters. A photograph or other artwork to be reproduced is scanned and the original scene is stored in electronic memory or directly output. FIG. 10 shows an exemplary high-level block diagram of a high end computer controlled apparatus which can be used by a human operator in implementing the process of FIG. 9. The operator interfaces with the apparatus through a keyboard or other appropriate hardware and software 140. A recorded scene 150 such as a photograph is passed under a scanner 110 to produce pixel data. That data is stored in a memory 130, which is typically a hard disk. A computer processor 100 is then used to select and modify dot patterns based on color and shading information in the pixel data. Halftone screens in primary colors or black are output through a printer/ imagesetter 120. The scenes are combined in preparation of a high quality halftone image 160, in accordance with the present invention.

Figure 1A:
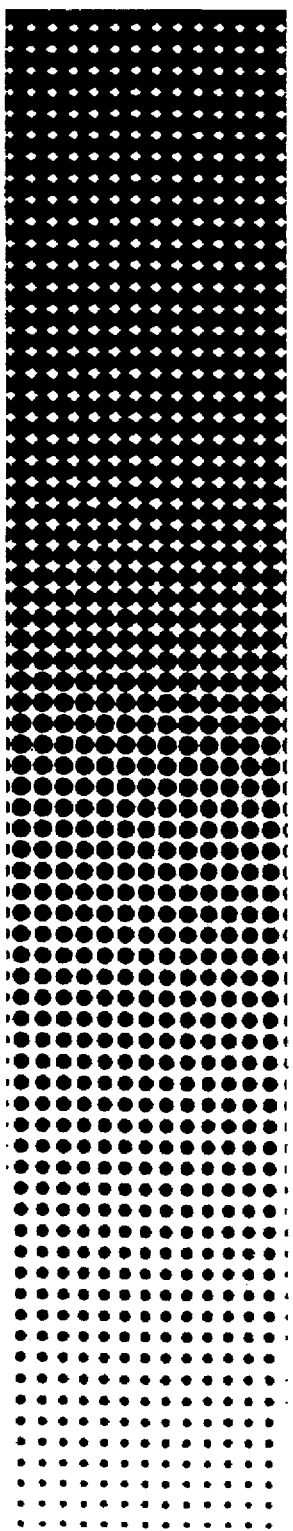
FIGS. 1a, 1b and 1c show coarse conventional round, square and elliptical dot patterns respectively, varying uniformly between light and dark tones.
Figure 1B:
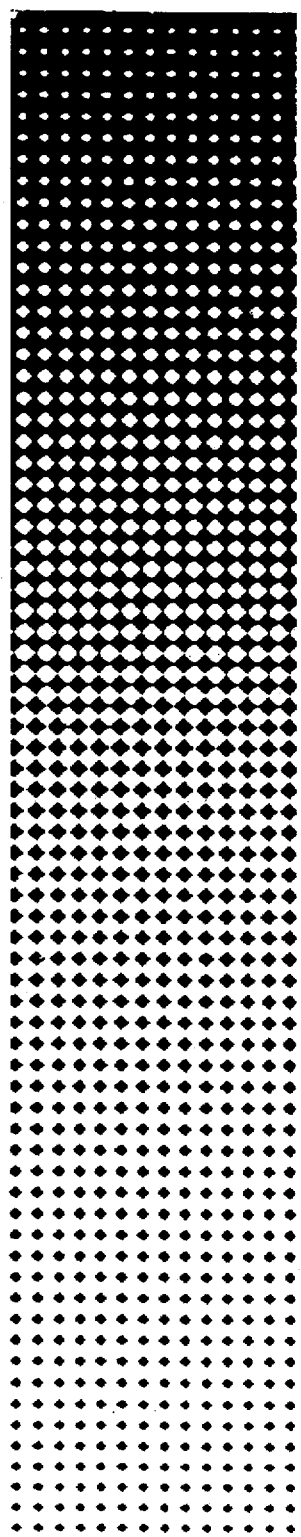
Figure 1C:
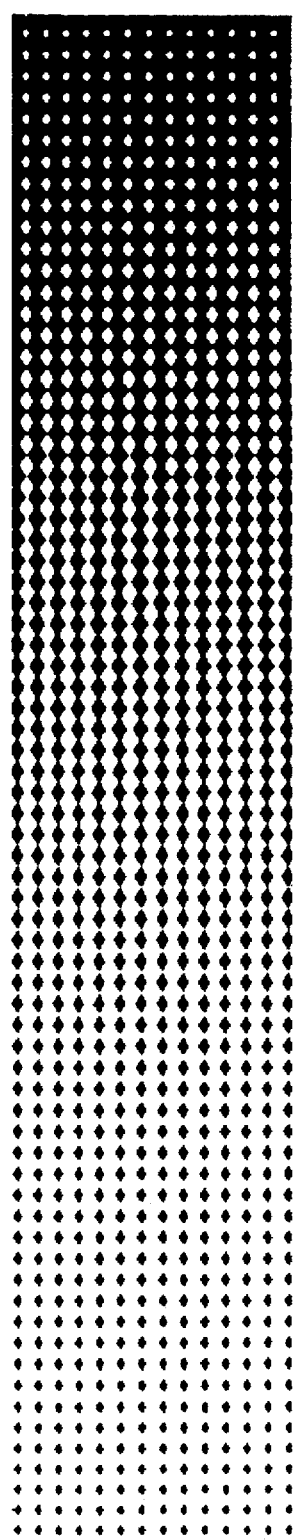

FIG. 1a, 1b and 1c show conventional round, square and "elliptical" dot patterns respectively, varying smoothly in size from about 10% print area density in light tones to about 90% area density in dark tones. Round dots have outwardly curved edges by definition whereas square or diamond shaped dots have flat edges between four points. The square patterns are invertible in that the printed areas in light tones have similar shapes to the non-printed areas in dark tones and vice versa.

Figure 2:
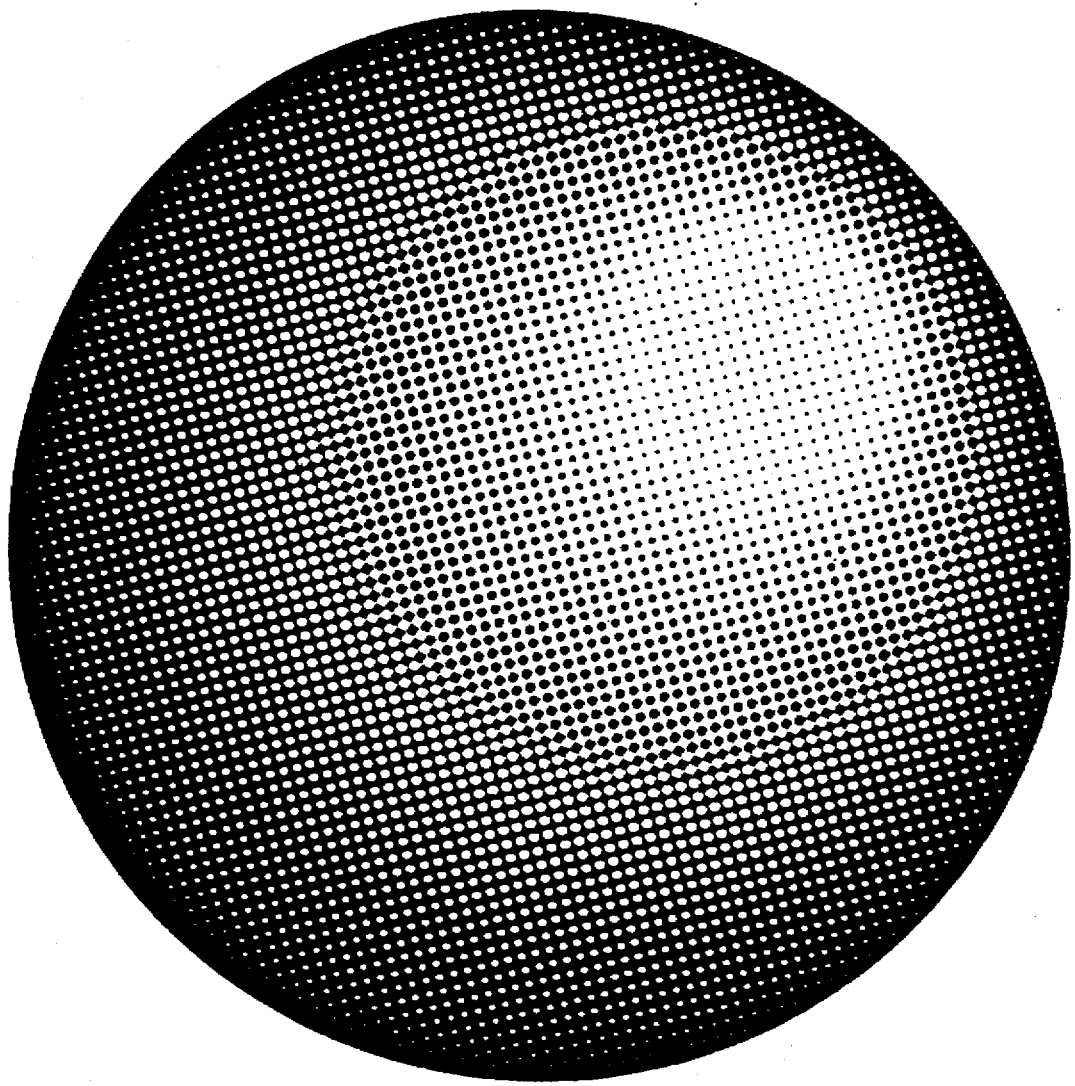
FIG. 2 is an illuminated globe image using a conventional variable round dot pattern.

FIG. 2 demonstrates a more complicated dot pattern in which conventional round dots in light tones become square dots in middle tones with reversal of the round dots in dark tones. This is often referred to as the Euclidean dot pattern. The edge curvature of printed areas correspondingly changes from outward to flat to inward respectively. Moiré effects do not arise in FIGS. 1 and 2 as only a single screen is present in each case. Dot gain is not apparent due to the magnification.

Figure 3:
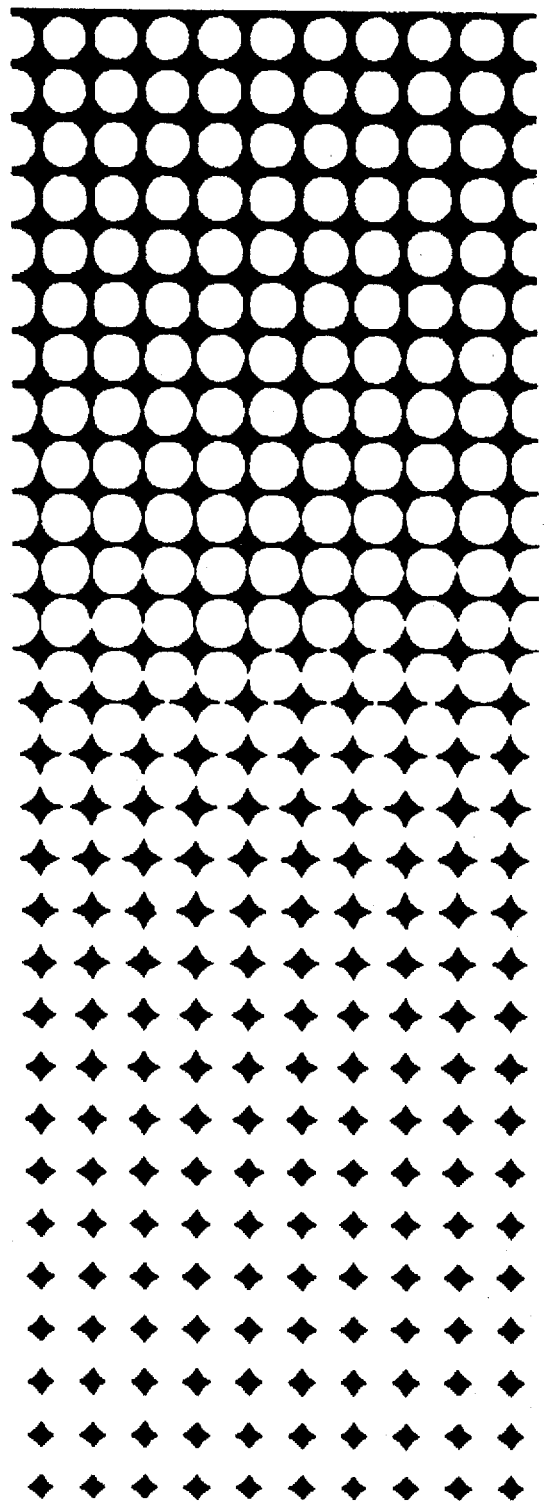
FIG. 3 shows reversal of a coarse conventional round dot pattern to produce printing areas having inwardly curved edges.

FIG. 3 shows a reversed round dot pattern varying uniformly from light to dark tones. The dots in light tones have inwardly curved edges between cusps distributed on two planes of mirror symmetry. Their points could perhaps be flattened or rounded as desired. Each dot meets its four nearest neighbors simultaneously at around 22% area density. Otherwise the inwards curvature extends along substantially the full length of all printed areas. The non-printed areas have corresponding outwardly curved edges and separate to appear as round dots in the dark tones. Overall the pattern is seen to be effectively a reversal or negative of the conventional round dot pattern in FIG. 1a throughout the entire range of tones, and in this respect may be considered a pattern of light round dots on a dark printed background. By virtue of this reversal of all print area edges are circles or circular arcs but could be other smooth curves as desired, or as required to link with the end points. Also the dots need not be fourfold symmetrical as shown. Rosette moiré effects in colored images can be reduced by printing dot patterns having inwardly curved edges as will be evident from later figures in which two screens are superimposed. Tone jumps due to dot gain remain a problem however, as with the conventional round dot pattern.

Figures 4A, 4B:
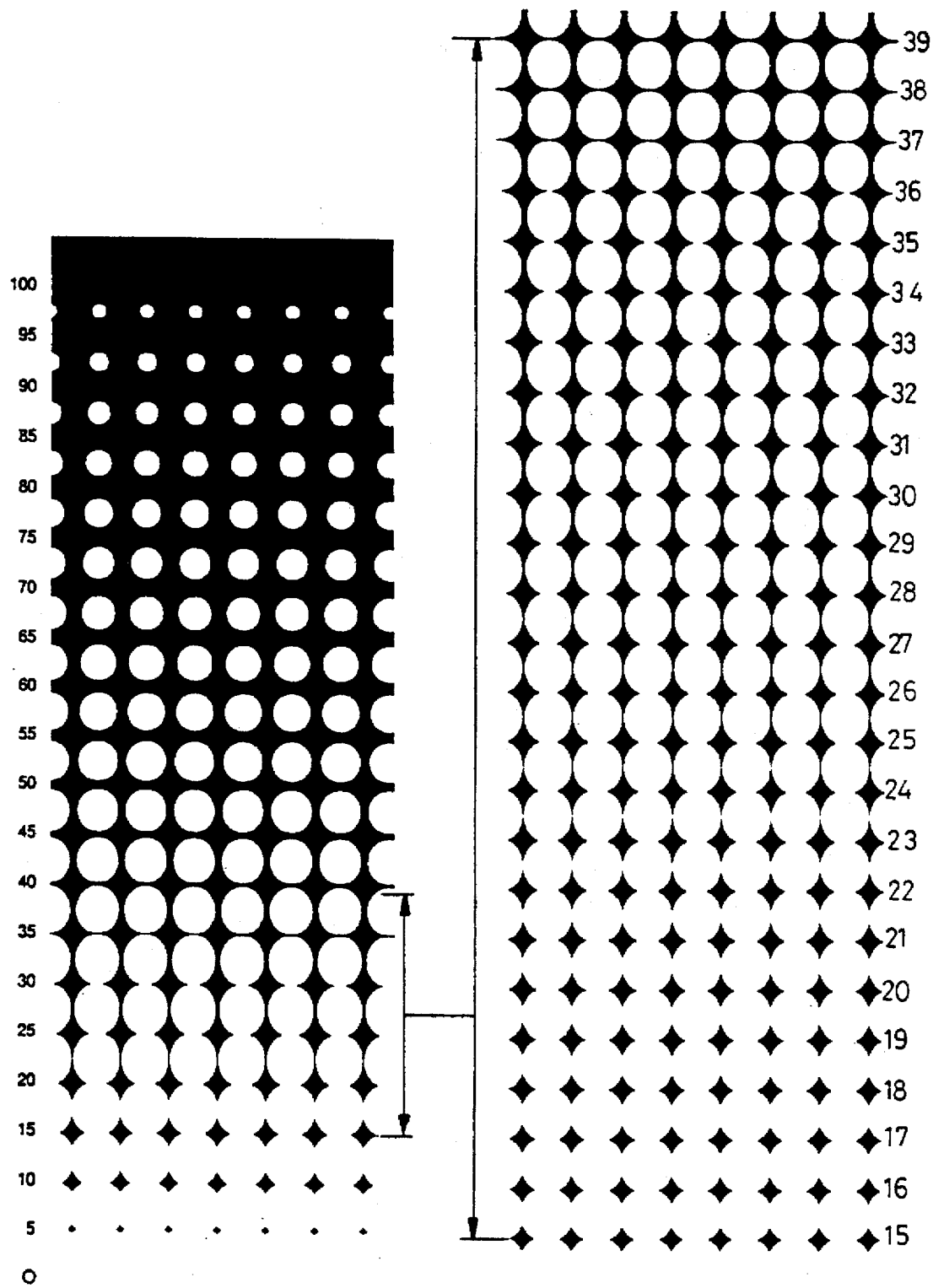
FIGS. 4a and 4b show reversal of a variable oval dot pattern in which the dots vary from round to oval and back to round according to the invention.

FIGS. 4a and 4b show a reversed variable oval dot pattern according to the invention. In this form the generally pin cushion shaped dots are elongated along a plane of mirror symmetry in light quarter to middle tones, so that nearest neighbors meet first vertically along the direction of tone darkening and then second horizontally in the corresponding perpendicular direction. Each dot meets two opposing pairs in two distinct stages of around 22% and 36% area density. This pattern is seen to be effectively a reversal or negative of a round dot pattern in which the dots become oval in middle tones. FIG. 4a shows a full range of tone from 0% to 100% while FIG. 4b shows more detail of the fourfold/twofold or alternatively the round/oval variation from about 15% to 39% area density. Rosette moiré effects can be reduced as with the pattern of FIG. 3, but now by controlling dot elongation the perceptibility of any tone jumps can also be reduced by splitting dot gain into two less obvious stages which in turn may be shifted among a range of tones.

Figure 5A:
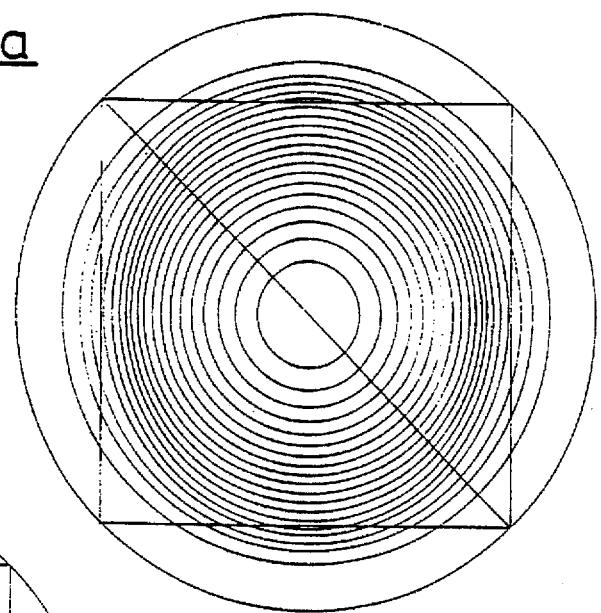
FIGS. 5a, 5b and 5c show example variable oval dot outlines superimposed upon common centers according to the invention.
Figure 5B:
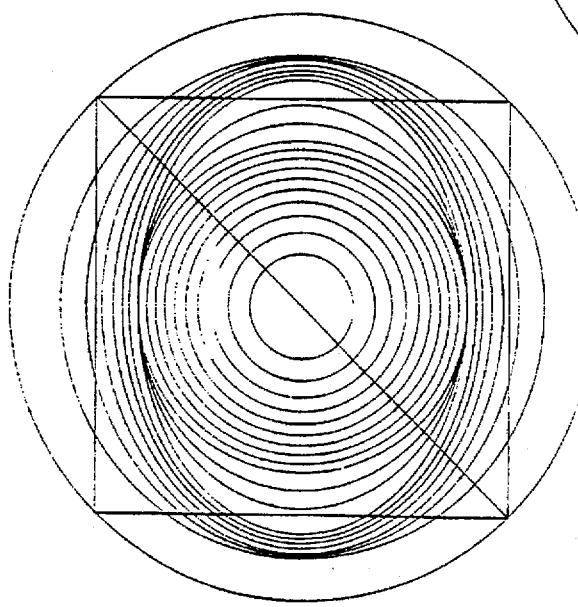
Figure 5C:
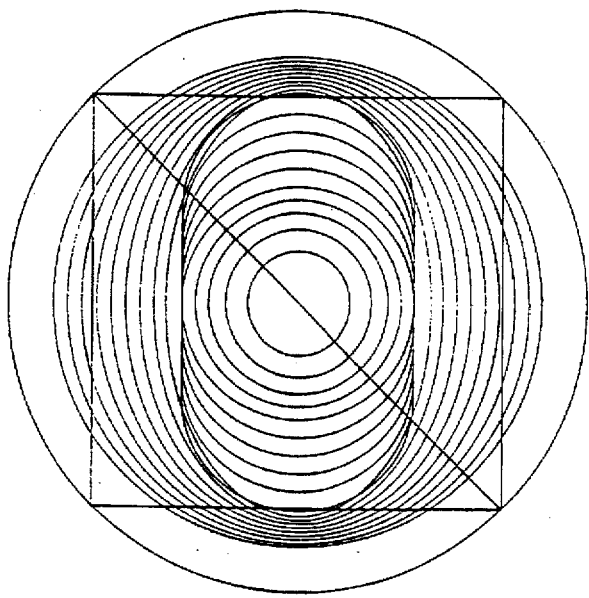

FIGS. 5a, 5b and 5c show example variations of dot edges according to the invention superimposed on common centers. The diagonally lined squares facilitate comparison and measurement of production. The edges are not necessarily mathematical ellipses but may take any suitable oval or approximately similar form as can be generated by computer. FIG. 5a shows the gentle round-oval-round variation of FIGS. 4a and 4b. FIGS. 5b and 5c show more severe distortions resulting in greater separation of the dot gain stages.

Figure 6A:
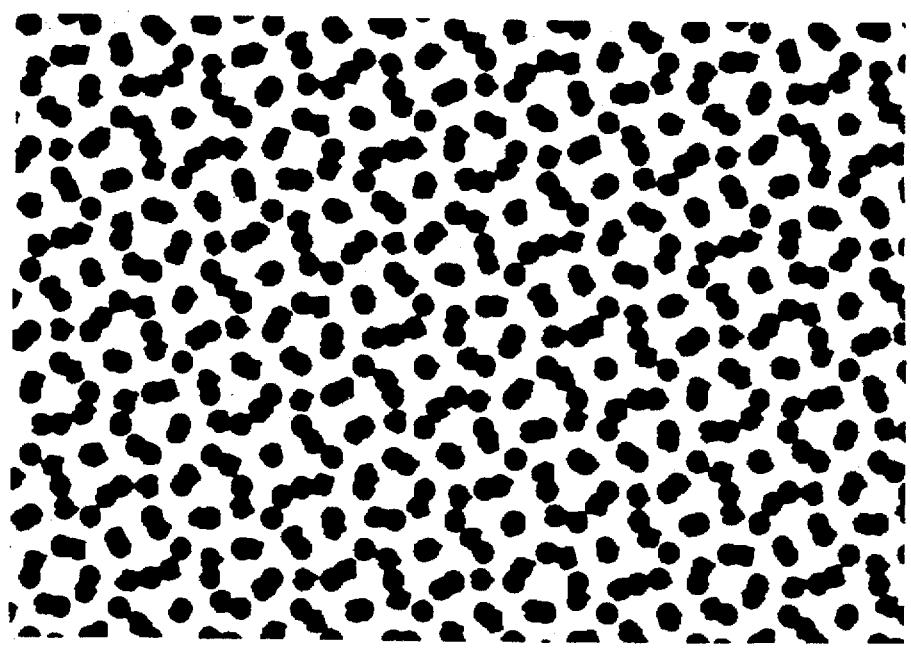
FIGS. 6a and 6b show respectively two conventional round dot screens overlapping at 30° and two reversed dot screens according to the invention overlapping at 90°.
Figure 6B:
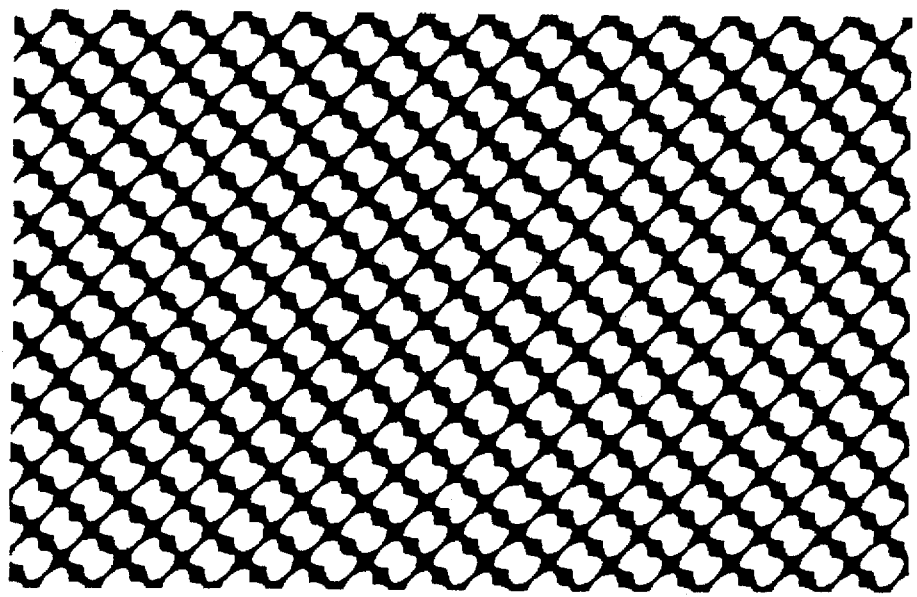

FIGS. 6a and 6b are an illustration of the reduction in rosette moiré effect which can be achieved according to the present invention. FIG. 6a shows rosettes created by superimposing two conventional round dot screens at 30°, as is common with cyan and magenta in colored images. FIG. 6b shows a smoother variation of similar tones created by superimposing two reversed variable oval dot screens at 90° according to the invention. Preparing colored images using all four possible screens is less straightforward.

It has been found that the primary color screens are apparently best placed at 45° angular separations, such as cyan 45°, magenta 135° and yellow 90°, with black placed at 0° and 90°. Further, that not every screen need be printed according to the invention. For example, at least cyan and magenta should use elongated dots of the reversed variable oval dot pattern, while yellow may use only the reversed round dot pattern. Black may only need the reversed round dot pattern, or may even give satisfactory images using the conventional round dot pattern itself.

It has also been found that black dots are often not necessary in preparing a well defined colored image. For example, the primary color screens may be used alone at the angles and with the patterns mentioned above.

It is also generally required that the cyan and magenta screens should be offset from each other to avoid possible color shifts. The offset should be about half a cell spacing parallel with either of the screen directions, for best results in view of the accidental offsets which often occur during printing. Yellow and black screens should also sometimes be offset to avoid color shifts. The nature of these offsets has yet to be fully explored but will be evident to a skilled reader working on a particular image.

In some images the possibility of color shifts and moiré effects has been reduced with the 45° angles and reversed patterns mentioned above, by decreasing the black screen ruling (increasing the dot frequency) by a factor of about cosine 45° (about 0.71) relative to cyan and magenta. In a smaller number of cases the yellow screen ruling has been correspondingly increased by this factor. Again the nature of these adjustments to the spacings has yet to be fully explored, but will be evident to a skilled reader working on particular images.

Figure 7A:
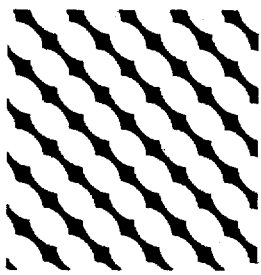
FIGS. 7a to 7i show example dot patterns for various screen combinations according to the invention.
Figure 7B:
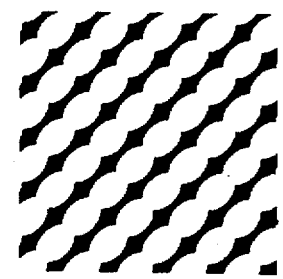
Figure 7C:
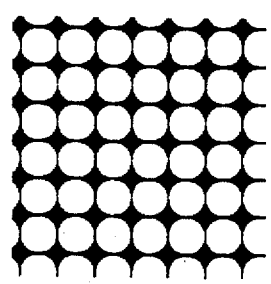
Figure 7D:
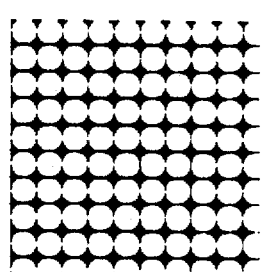
Figure 7E:
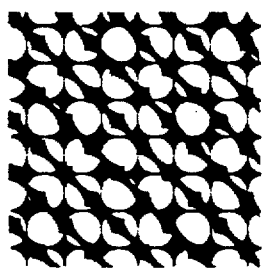
Figure 7F:
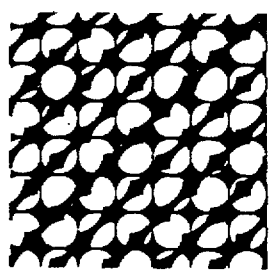
Figure 7G:
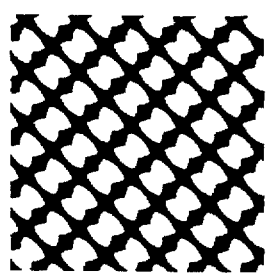
Figure 7H:
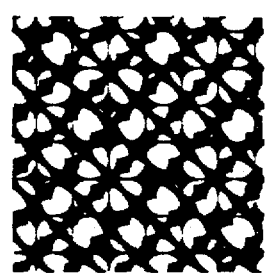
Figure 7I:
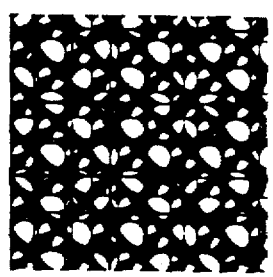

FIGS. 7a to 7i show the dot patterns of a test which has been carried out to date according to the invention. FIGS. 7a to 7d represent individual screens of cyan 135°, magenta 45°, yellow 0°and black 0°/90°, all at tone values where the printing and non-printing areas have linked with two or four of their nearest neighbors. Cyan and magenta use the reversed variable oval dot pattern. Yellow and black use simply the reversed round dot pattern. The black screen ruling has been reduced by a factor of about 0.71 relative to the others. FIGS. 7e to 7g show screens superimposed in pairs, namely cyan/yellow, magenta/yellow and cyan/magenta. In FIGS. 7f and 7g the cyan and magenta have been offset by half a cell parallel to their screen directions, which are diagonal on the page as shown. The visible effect is somewhat unrealistic in that yellow normally has substantially less impact on the eye than the darker colors but here all colors must be shown equally in black. FIG. 7h shows the cyan, magenta and yellow screens superimposed. A very slight moiré effect is apparent primarily because the colors must be shown in black as mentioned. FIG. 7i shows the black screen of FIG. 7d superimposed on FIG. 7h. Again there is a slight moiré effect due to the overall black color representation whereas under normal printing circumstances the colors would have different impacts and the final image screen would be virtually moiré free.

Figure 8A:
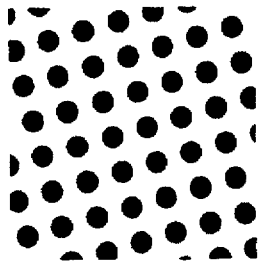
FIGS. 8a to 8i show corresponding conventional round dot patterns for contrast with FIGS. 7a to 7i.
Figure 8B:
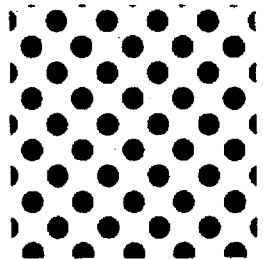
Figure 8C:
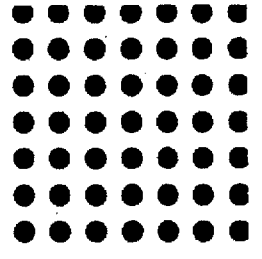
Figure 8D:
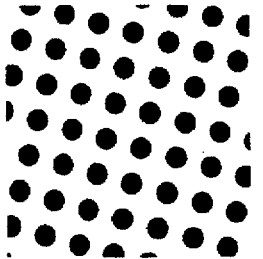
Figure 8E:
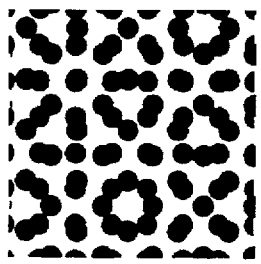
Figure 8F:
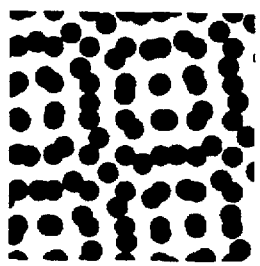
Figure 8G:
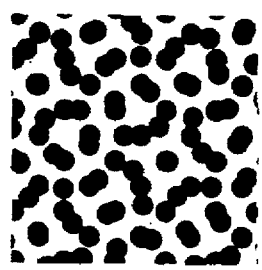
Figure 8H:
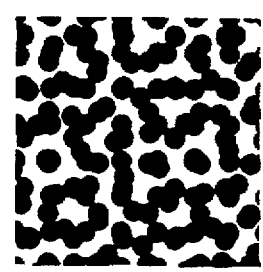
Figure 8I:
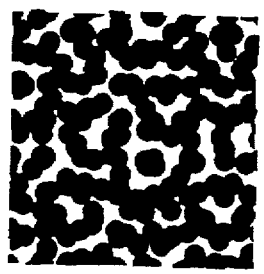

FIGS. 8a to 8i show an attempt to contrast with FIGS. 7a to 7i, the conventional round dot patterns which would typically have been used. FIGS. 8a to 8d represent individual screens of cyan 15°, magenta 45°, yellow 0°and black 75°. FIGS. 8e to 8g show these screens superimposed in pairs, namely cyan/yellow, magenta/yellow and cyan/magenta. FIG. 8h shows the cyan, magenta and yellow screens superimposed. FIG. 8i shows the black screen of FIG. 8d superimposed on FIG. 8h. Both large and small scale moiré effects can be seen in these figures, although the effects are not so apparent as they normally would be in a complete colored image at normal screen rulings. The effects of dot gain are not at all apparent due to the artificial manner in which these figures must be presented.

What is claimed is:

1. A method of preparing halftone screens prior to printing a colored image comprising the steps of:
   (a) receiving information representing color and tone variation in a previously recorded scene;
   (b) processing the information to create halftone screens representing primary colors in the scene, by
      1) creating cyan and magenta screens having printing areas with inwardly curved edges, and
      2) orienting each primary color screen at an angle which is approximately a multiple of 45° to any other primary color screen; and
   (c) producing halftone screens representing primary colors in a form appropriate for subsequent printing of the colored image.

2. A method according to claim 1, further comprising the step of:
   creating the cyan and magenta screens having printing areas in light tones formed as dots which are increasingly elongated with darkening tones.

3. A method according to claim 2, further comprising:
   joining the dots in two distinct stages as tone darkens or lightens respectively.

4. A method according to claim 1, further comprising the step of:
   creating the cyan and magenta screens having non-printing areas in dark tones formed as dots which are increasingly elongated with lightening tones.

5. A method according to claim 4, further comprising:
   joining the dots in two distinct stages as tone darkens or lightens respectively.

6. A method according to claim 1, further comprising the step of:
   creating cyan and magenta screens which are relatively offset.

7. A method according to claim 1, further comprising the step of:
   creating cyan and magenta screens having printing areas which in light tones are inwardly curved on every edge.

8. A method according to claim 1; further comprising the step of:
   creating every primary color screen having printing areas with inwardly curved edges.

9. A method according to claim 1, further comprising the step of:
   creating a black screen having printing areas with inwardly curved edges.

10. A method according to claim 9, further comprising the step of:
    orienting yellow and black screens at approximately 90° to each other.

11. A method according to claim 9, further comprising the step of:
    orienting the black screen at an angle which is approximately a multiple of 45° to any other screen.

12. A method according to claim 11, further comprising the step of:
    creating the black screen with a screen ruling which is reduced by a factor of approximately 0.71 relatively to the cyan and magenta screens.

13. A method according to claim 1; further comprising the step of:
    orienting the cyan and magenta screens at approximately 90° to each other.

14. A method of printing halftone screens to form a colored image, comprising the steps of:
    (a) receiving information representing primarily colored halftone screens, wherein cyan and magenta screens have printing areas with inwardly curved edges;
    (b) orienting each primary color screen at an angle which is approximately a multiple of 45° to any other primary color screen; and
    (b) superimposing and printing the oriented primary color screens to form a colored image.

15. A method according to claim 14, further comprising the steps of:
    receiving information representing a black halftone screen,
    orienting the black halftone screen at an angle which is approximately a multiple of 45° to any other screen, and
    printing the oriented black color screen with the primary color screens to form the colored image.

16. A computer controlled apparatus for preparing halftone screens representing a colored image, comprising:
    means for scanning a previously recorded scene to produce information representing color and tone variation in the scene,
    means for processing the information to create halftone screens representing the primary colors and black tone variation in the scene; and
    means for producing the halftone screens in or on an output medium;
    wherein the means for processing includes means for creating cyan and magenta screens having printing areas with inwardly curved edges, and means for orienting each primary color screen at an angle which is approximately a multiple of 45° to any other primary color screen.

17. Apparatus according to claim 16, wherein the means for processing further comprises means for producing tone variation in the primary color halftone screens by creating printing areas which vary in elongation between light and dark tones.

18. Apparatus according to claim 16, wherein the means for processing further comprises includes means for producing tone variation in the primary color halftone screens by creating non-printing areas which vary in elongation between dark and light tones.

19. A computer controlled apparatus for preparing halftone screens representing a colored image, comprising:
    (a) means for receiving information representing color and tone variation in a previously recorded scene;
    (b) means for processing the information to create halftone screens representing primary colors in the scene; and
    (c) means for producing halftone screens representing primary colors in a form appropriate for subsequent printing of the colored image;
    wherein the means for processing includes means for creating cyan and magenta screens having printing areas with inwardly curved edges, and means for orienting: each primary color screen at an angle which is approximately a multiple of 45° to any other primary color screen.

20. Apparatus according to claim 19, wherein the means for processing includes means for producing tone variation in the primary color halftone screens by creating printing areas which vary in elongation between light and dark tones.

21. Apparatus according to claim 20, wherein the means for processing includes means for joining the printing areas in two distinct stages as tone darkness or lightens respectively.

22. Apparatus according to claim 19, wherein the means for processing includes means for producing tone variation in the primary color halftone screens by creating non-printing areas which vary in elongation between dark and light tones.

23. Apparatus according to claim 22, wherein the means for processing includes means for joining the non-printing areas in two distinct stages as tone darkness or lightens respectively.

24. A process of preparing a halftone image wherein tone variation in cyan and magenta screens is produced by creating the steps of:

creating printing areas which have inwardly curved edges; and placing each primary color screen at an angle of approximately 45° to any other primary color screen.

* * * * *